United States Patent
Li

(10) Patent No.: US 11,031,563 B1
(45) Date of Patent: Jun. 8, 2021

(54) FLEXIBLE ORGANIC LIGHT-EMITTING DIODE DISPLAY PANEL AND FLEXIBLE ORGANIC LIGHT-EMITTING DIODE DISPLAY DEVICE

(71) Applicant: WUHAN CHINA STAR OPTOELECTRONICS SEMICONDUCTOR DISPLAY TECHNOLOGY CO., LTD., Wuhan (CN)

(72) Inventor: Yun Li, Wuhan (CN)

( * ) Notice: Subject to any disclaimer, the term of this patent is extended or adjusted under 35 U.S.C. 154(b) by 306 days.

(21) Appl. No.: 16/339,360

(22) PCT Filed: Oct. 12, 2018

(86) PCT No.: PCT/CN2018/110031
§ 371 (c)(1),
(2) Date: Apr. 4, 2019

(87) PCT Pub. No.: WO2019/218584
PCT Pub. Date: Nov. 21, 2019

(30) Foreign Application Priority Data

May 17, 2018 (CN) .......................... 201810473592.7

(51) Int. Cl.
*H01L 51/00* (2006.01)
(52) U.S. Cl.
CPC .. *H01L 51/0097* (2013.01); *H01L 2251/5338* (2013.01)
(58) Field of Classification Search
CPC .................... H01L 51/0097; H01L 2251/5338
See application file for complete search history.

(56) References Cited

U.S. PATENT DOCUMENTS

| | | | | |
|---|---|---|---|---|
| 9,195,108 B2* | 11/2015 | Park | .................. | H01L 27/124 |
| 9,472,784 B2* | 10/2016 | Sun | .................... | H01L 51/5259 |
| 9,666,831 B2* | 5/2017 | Hong | ................. | H01L 51/5246 |
| 10,074,824 B2* | 9/2018 | Han | ...................... | G06F 1/3265 |
| 10,243,024 B2* | 3/2019 | Jin | ..................... | H01L 27/1218 |
| 10,270,047 B2* | 4/2019 | Chen | ................... | H01L 27/3204 |
| 10,347,852 B2* | 7/2019 | Myeong | ............... | G06F 1/1652 |
| 10,446,769 B2* | 10/2019 | Kim | .................. | G02F 1/133305 |
| 10,856,420 B2* | 12/2020 | Kim | ................... | H01L 51/0097 |
| 2014/0290864 A1* | 10/2014 | Ahn | ..................... | B32B 43/006 156/379.8 |
| 2016/0291783 A1 | 10/2016 | Cotton et al. | | |

(Continued)

FOREIGN PATENT DOCUMENTS

| | | |
|---|---|---|
| CN | 206400960 U | 8/2017 |
| CN | 107611162 A | 1/2018 |

*Primary Examiner* — Ida M Soward

(57) ABSTRACT

A flexible organic light-emitting diode (OLED) display panel and a flexible OLED display device are provided, and include a base substrate and a flexible structural layer which has at least two flexible layers disposed one on the other. The panel has a folding section for folding, the flexible layers are formed with a plurality of sets of relief holes defined within the folding section, and the relief holes of the adjacent flexible layers are staggered with respect to each other. When the OLED display panel is in a folded state, the relief holes of one of the flexible layers which is located at an inner ring of the folding section buffer a compression force, and the relief holes of another of the flexible layers which is located at an outer ring of the folding section buffer a tensile force.

20 Claims, 3 Drawing Sheets

(56) References Cited

U.S. PATENT DOCUMENTS

| | | | |
|---|---|---|---|
| 2017/0309843 A1* | 10/2017 | Kim | B32B 3/266 |
| 2018/0232080 A1* | 8/2018 | Iwami | G06F 3/0446 |
| 2019/0146266 A1* | 5/2019 | Namkung | G02F 1/133345 |
| | | | 361/749 |
| 2019/0214586 A1* | 7/2019 | Li | H01L 51/56 |
| 2020/0287158 A1* | 9/2020 | Kim | H01L 23/552 |

* cited by examiner

FLEXIBLE ORGANIC LIGHT-EMITTING DIODE DISPLAY PANEL AND FLEXIBLE ORGANIC LIGHT-EMITTING DIODE DISPLAY DEVICE

FIELD OF INVENTION

The present application relates to a field of display technologies, and more particularly to a flexible organic light-emitting diode display panel and a flexible organic light-emitting diode display device.

BACKGROUND OF INVENTION

In the field of display technologies, flat panel display devices, such as liquid crystal displays (LCD) and organic light-emitting diodes (OLED), have gradually replaced cathode line displays.

Among the flat panel display devices, OLED display panels have many advantages, such as being self-luminous, having a low driving voltage and high electroluminescent efficiency, high resolution, contrast, and capacity to achieve flexible display panels, and large scale full-color displays.

A conventional OLED display panel includes a base substrate, and a display module disposed on the base plate. The display module includes a substrate disposed on the base substrate, a thin film transistor disposed on the substrate, a patterned pixel-definition layer disposed on the thin film transistor, and an OLED element disposed within the pixel-definition layer. A double-layer polyimide (PI) film is generally used to serve as the base substrate. However, when the PI film is being folded, the PI film may be irreversibly damaged due to a compression force received by an inner ring of the PI film, and a tensile force received by an outer ring of the PI film.

Therefore, it is necessary to provide a flexible OLED display panel with a substrate structure which is capable of buffering the compression force and the tensile force in order to solve the abovementioned technical problems.

SUMMARY OF INVENTION

The embodiment of the present application provides a flexible organic light-emitting diode (OLED) display panel and a flexible OLED display device having substrate structures which are capable of buffering the compression force and the tensile forces, so as to solve the technical problem that the substrate of the existing OLED display panel is prone to damage when it is folded.

An embodiment of the present application provides a flexible organic light-emitting diode (OLED) display panel, comprising:

a folding section for folding, wherein a substrate structure is disposed at the folding section and an OLED display module is disposed on the substrate structure, wherein the substrate structure comprises:

a base substrate; and a flexible structural layer disposed on the base substrate, wherein the flexible structural layer comprises at least two flexible layers arranged one on the other;

wherein the flexible layers comprise a plurality of sets of relief holes defined within the folding section, and the relief holes of the adjacent flexible layers are staggered with respect to each other;

wherein, when the OLED display panel is in a folded state, a diameter of the relief holes of one of the flexible layers which is located at an inner ring of the folding section is reduced by a compression force so as to buffer the compression force received by the flexible layer; and a diameter of the relief holes of another of the flexible layers, which is located at an outer ring of the folding section, is enlarged by a tensile force so as to buffer the tensile force received by the flexible layer; and wherein shapes of the relief holes of each set of the relief holes are selected from the group comprising a point, a rectangle, a diamond, a circle, and combinations thereof; and the adjacent sets of the relief holes in the same flexible layer are staggered with respect to each other.

In a first embodiment of the flexible OLED display panel of the present application, the flexible structural layer comprises two of the flexible layers, a first flexible layer is disposed on the base substrate, and a second flexible layer is disposed on the first flexible layer; when the flexible OLED display panel is inwardly folded, the first flexible layer is located at the outer ring of the folding section, and the second flexible layer is located at the inner ring of the folding section, and wherein a number of the sets of the relief holes of the first flexible layer is more than a number of the sets of the relief holes of the second flexible layer.

In the first embodiment of the flexible OLED display panel of the present application, the number of the sets of the relief holes of the second flexible layer is one more than the number of the sets of the relief holes of the first flexible layer.

In a second embodiment of the flexible OLED display panel of the present application, the flexible structural layer comprises two of the flexible layers, a first flexible layer is disposed on the base substrate, and a second flexible layer is disposed on the first flexible layer; when the flexible OLED display panel is outwardly folded, the first flexible layer is located at the inner ring of the folding section and the second flexible layer is located at the outer ring of the folding section, and wherein a number of the sets of the relief holes of the second flexible layer is more than a number of the sets of the relief holes of the first flexible layer.

In a third embodiment of the flexible OLED display panel of the present application, the flexible structural layer comprises three of the flexible layers, a first flexible layer is disposed on the base substrate, a second flexible layer is disposed on the first flexible layer, and a third flexible layer is disposed on the second flexible layer; and wherein a number of the sets of the relief holes of the first flexible layer is equal to a number of the sets of the relief holes of a third flexible layer, and a number of the sets of the relief holes of the second flexible layer is less than the number of the sets of the relief holes of the first flexible layer.

In the third embodiment of the flexible OLED display panel of the present application, the number of the sets of the relief holes of the second flexible layer is one less than the number of the sets of the relief holes of the first flexible layer.

In the flexible OLED display panel of the present application, the flexible layers are polyimide layers.

The present application provides an additional flexible organic light-emitting diode (OLED) display panel, comprising:

a substrate structure and an OLED display module disposed on the substrate structure, wherein the substrate structure comprises:

a base substrate; and a flexible structural layer disposed on the base substrate, wherein the flexible structural layer comprises at least two flexible layers arranged one on the other;

wherein the OLED display panel comprises a folding section for folding, the flexible layers comprise a plurality of sets of relief holes defined within the folding section, and the relief holes of the adjacent flexible layers are staggered with respect to each other; and wherein, when the OLED display panel is in a folded state, a diameter of the relief holes of one of the flexible layers which is located at an inner ring of the folding section is reduced by a compression force so as to buffer the compression force received by the flexible layer; and a diameter of the relief holes of another of the flexible layers which is located at an outer ring of the folding section is enlarged by a tensile force so as to buffer the tensile force received by the flexible layer.

In an additional first embodiment of the flexible OLED display panel of the present application, the flexible structural layer comprises two of the flexible layers, a first flexible layer is disposed on the base substrate, and a second flexible layer is disposed on the first flexible layer; when the flexible OLED display panel is inwardly folded, the first flexible layer is located at the outer ring of the folding section, and the second flexible layer is located at the inner ring of the folding section, and wherein a number of the sets of the relief holes of the first flexible layer is more than a number of the sets of the relief holes of the second flexible layer.

In the additional first embodiment of the flexible OLED display panel of the present application, the number of the sets of the relief holes of the second flexible layer is one more than the number of the sets of the relief holes of the first flexible layer.

In the additional first embodiment of the flexible OLED display panel of the present application, the flexible structural layer is composed of the first flexible layer and the second flexible which are arranged one on the other. When the flexible OLED display panel is inwardly folded, i.e., the OLED display panel is folded towards the OLED display module, the relief holes of the first flexible layer and the relief holes of the second flexible layer are staggered with respect to each other, so that all the relief holes achieve respective supports, not affecting normal uses.

In addition, when being inwardly folded, a compassion force is received by the second flexible layer and a tensile force is received by the first flexible layer. Therefore, in order to further buffer the tensile force, the number of the sets of the relief holes of the second flexible layer is more than the number of the sets of the relief holes of the first flexible layer.

In the additional second embodiments of the present application, it is different from the additional first embodiment in that the flexible structural layer comprises two of the flexible layers, a first flexible layer is disposed on the base substrate, and a second flexible layer is disposed on the first flexible layer; when the flexible OLED display panel is outwardly folded, the first flexible layer is located at the inner ring of the folding section and the second flexible layer is located at the outer ring of the folding section, and wherein a number of the sets of the relief holes of the second flexible layer is more than a number of the sets of the relief holes of the first flexible layer.

In the additional second embodiments of the present application, the number of the sets of the relief holes of the second flexible layer is one more than the number of the sets of the relief holes of the first flexible layer.

In an additional third embodiments of the present application, it is different from another third embodiment and the additional first embodiment in that the flexible structural layer comprises three of the flexible layers, a first flexible layer is disposed on the base substrate, a second flexible layer is disposed on the first flexible layer, and a third flexible layer is disposed on the second flexible layer; and wherein a number of the sets of the relief holes of the first flexible layer is equal to a number of the sets of the relief holes of a third flexible layer, and a number of the sets of the relief holes of the second flexible layer is less than the number of the sets of the relief holes of the first flexible layer.

In an additional third embodiments of the present application, the number of the sets of the relief holes of the second flexible layer is one less than the number of the sets of the relief holes of the first flexible layer.

In an additional third embodiments of the present application, the number of the sets of the relief holes of the first flexible layer adjacent to the base substrate and the third flexible layer adjacent to the OLED display module are more than the number of the sets of the relief holes of the second flexible layer, so that both in-folding and out-folding of the OLED display panel can be achieved without damaging the substrate structure.

In addition, in the additional first embodiment, the additional second embodiment, and the additional third embodiment, the flexible layers are polyimide layer.

In the additional first embodiment, the additional second embodiment, shapes of the relief holes of each set of the relief holes are selected from the group comprising a point, a rectangle, a diamond, a circle, and combinations thereof.

In the additional first embodiment, the additional second embodiment, the adjacent sets of the relief holes in the same flexible layer are staggered with respect to each other The present application further relates to a flexible OLED display device, comprising:

a flexible OLED display panel, the flexible OLED display panel comprises a folding section for folding, wherein a substrate structure is disposed at the folding section and an OLED display module is disposed on the substrate structure, wherein the substrate structure comprises:

a base substrate; and a flexible structural layer disposed on the base substrate, wherein the flexible structural layer comprises at least two flexible layers arranged one on the other;

wherein the flexible layers comprise a plurality of sets of relief holes defined within the folding section and the relief holes of the adjacent flexible layers are staggered with respect to each other; and wherein, when the OLED display panel is in a folded state, a diameter of the relief holes of one of the flexible layers which is located at an inner ring of the folding section is reduced by a compression force so as to buffer the compression force received by the flexible layer; and a diameter of the relief holes of another of the flexible layers which is located at an outer ring of the folding section is enlarged by a tensile force so as to buffer the tensile force received by the flexible layer.

In a first embodiment of the flexible OLED display device, the flexible structural layer comprises two of the flexible layers, a first flexible layer is disposed on the base substrate, and a second flexible layer is disposed on the first flexible layer; when the flexible OLED display panel is inwardly folded, the first flexible layer is located at the outer ring of the folding section, and the second flexible layer is located at the inner ring of the folding section.

In a first embodiment of the flexible OLED display device, a number of the sets of the relief holes of the first flexible layer is more than a number of the sets of the relief holes of the second flexible layer.

In the first embodiment of the flexible OLED display device, the number of the sets of the relief holes of the first flexible layer is one more than the number of the sets of the relief holes of the second flexible layer.

The flexible OLED display panel further comprises a second embodiment and a third embodiment of the abovementioned flexible OLED display panel. Please refer to the content of the abovementioned flexible OLED display panel of the present application for details.

Compared with the OLED display panels of the prior art, the flexible OLED display panel and the flexible OLED display device of the present application disposes a flexible structural layer having at least two flexible layer and the relief holes of the adjacent flexible layers are staggered to each other. On one hand, all the relief holes achieve respective supports to avoid adverse effects.

On the other hand, when the OLED display panel is folded, a diameter of the relief holes of the flexible layer which is located at an inner ring of the bending section is reduced by a compression force so as to buffer the compression force. A diameter of the relief holes of the flexible layer which is located at an outer ring of the bending section is enlarged by a tensile force so as to buffer the tensile force. The OLED display panel is prevented from being damaged when it is folded.

The present application solves the technical problem that the substrates of the existing OLED display panels are prone to damage when they are folded.

DESCRIPTION OF DRAWINGS

In order to illustrate a technical solution in the embodiments of the present application or in the prior art more clearly, the accompanying drawings required in the embodiments are introduced briefly hereafter. The accompanying drawings in the following description are merely part of the embodiments of the present application. Based upon the accompanying drawings, people with ordinary skills in the art can obtain other drawings without making inventive efforts.

DETAILED DESCRIPTION OF PREFERRED EMBODIMENTS

Figure 1:
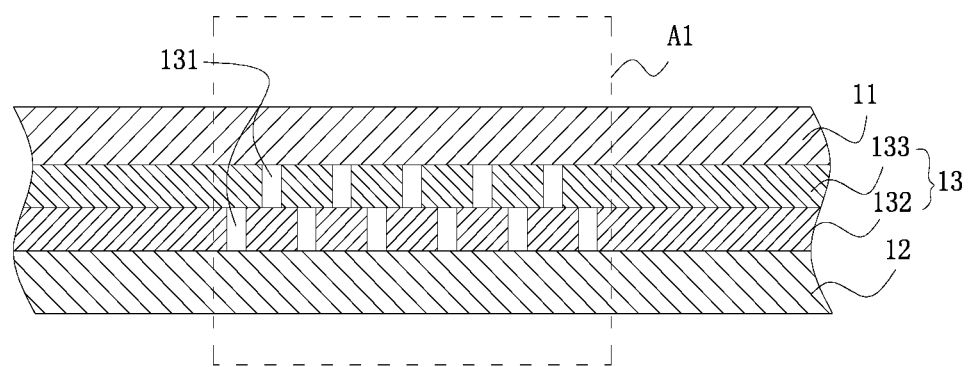
FIG. 1 is a cross-sectional structural view of a first embodiment of a flexible organic light-emitting diode (OLED) display panel of the present application, shown in a flattened state.

Referring to the drawings in the accompanying drawings, same reference numerals represent same components. The following description is based on the detailed embodiments of the present invention as exemplified, and should not be construed as a limitation to other embodiments of the present application which are not described herein in detail.

Figure 2:
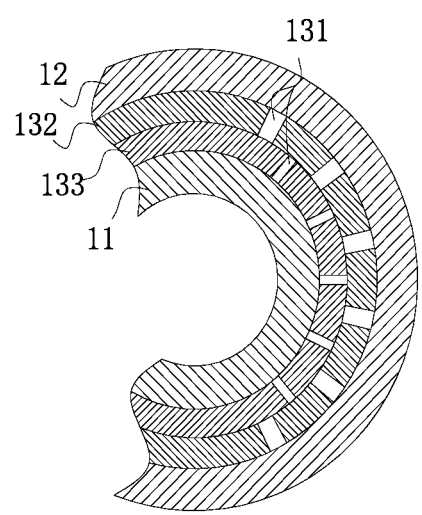
FIG. 2 is a cross-sectional structural view of the first embodiment of the flexible OLED display panel of the present application, shown in a folded state.
Figure 3:
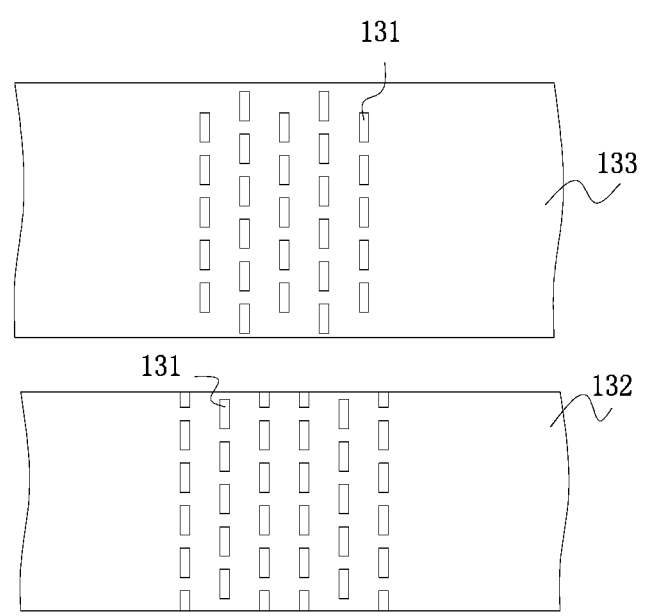
FIG. 3 is a top structural view of a first flexible layer and a second flexible layer of the first embodiment of the flexible OLED display panel of the present application.

Please refer to FIG. 1-3, FIG. 1 is a cross-sectional structural view of a first embodiment of a flexible OLED display panel of the present application, shown in a flattened state; FIG. 2 is a cross-sectional structural view of the first embodiment of the flexible OLED display panel of the present application, shown in a folded state; FIG. 3 is a top structural view of a first flexible layer and a second flexible layer of the first embodiment of the flexible OLED display panel of the present application.

A flexible OLED display panel 1 according to the first embodiment of the present application includes a substrate structure 10 and an OLED display module 11 disposed on the substrate structure. The substrate structure comprises a base substrate 12 and a flexible structural layer 13. The OLED display module comprises a substrate disposed on the substrate structure, a thin film transistor disposed on the substrate, a patterned pixel-definition layer disposed on the thin film transistor, and an OLED element disposed within the pixel-definition layer.

In particular, the flexible structural layer 13 is disposed on the base substrate 12, and the flexible structural layer 13 is formed by superposing at least two flexible layers.

The OLED display panel comprises a folding portion A1 for folding, and the flexible layer includes a plurality of sets of the relief holes 131 disposed in the folding section, and the relief holes 131 of the adjacent flexible layers 13 are staggered with respect to each other.

When the OLED display panel is in a folded state, a diameter of the relief holes 131 of the flexible layer which is located at an inner ring of the folding section A1 is reduced by a compression force so as to buffer the compression force received by the flexible layer, and a diameter of the relief holes 131 of the flexible layer which is located at an outer ring of the folding section A1 is enlarged by a tensile force so as to buffer the tensile force received by the flexible layer.

On one hand, the adjacent sets of the relief holes in the same flexible layer are staggered with respect to each other, so that all the relief holes achieve respective supports, not affecting normal use. On the other hand, the disposing of at least two soft layers increases flexibility and guarantees a certain supportive force.

In addition, when the flexible OLED display panel is inwardly folded (i.e., the OLED display panel is folded towards the OLED display module), the diameter of the relief holes 131 of the flexible layer which is located at an inner ring of the folding section A1 is reduced by the compression force so as to buffer the compression force received by the flexible layer; and the diameter of the relief holes 131 of the flexible layer which is located at an outer ring of the folding section A1 is enlarged by the tensile force so as to buffer the tensile force received by the flexible layer. Accordingly, the OLED display panel is prevented from being damaged when it is folded.

In addition, the flexible layer is a polyimide layer, and polyimide possesses excellent mechanical properties.

In particular, in the first embodiment of the present application, the flexible structural layer comprises two of the flexible layers, a first flexible layer 132 is disposed on the base substrate 12, and a second flexible layer 133 is disposed on the first flexible layer 132. When the flexible OLED display panel is inwardly folded, the first flexible layer 132 is located at the outer ring of the folding section A1 and the second flexible layer 133 is located at the inner ring of the folding section A1.

A number of the sets of the relief holes of the first flexible layer is greater than a number of the sets of the relief holes of the second flexible layer. Such an arrangement not only buffers the compression force received by the first flexible layer 132, but also further buffers the tensile force received by the first flexible layer.

Furthermore, the number of the sets of the relief holes 131 of the second flexible layer 133 is one more than the number of the sets of the relief holes 131 of the first flexible layer 132.

Because—the first flexible layer 132 and the second flexible layer 133 are thin, the flexibility and support force of the first flexible layer 132 located in the folding area A1 are reduced if a plurality of sets of the relief holes 131 are defined on the first flexible layer 132. Therefore, in a case where the compression force and the tensile force are buffered without damaging the substrate structure, it is most preferred that there is one more set of relief holes 131 of the first flexible layer 132 than the sets of the relief holes 131 of the second flexible layer 133.

In the present first embodiment, shapes of the relief holes of each set of the relief holes 131 are selected from the group comprising a point, a rectangle, a diamond, a circle, and combinations thereof. The shape of each of the relief hole 131 could be a line, etc. The shapes of the relief holes 131 are not limited thereto.

Please refer to FIG. 3, in the present first embodiment, the first flexible layer 132 is provided with six sets of the relief holes 131, and each set of the relief holes 131 is formed by a plurality of rectangular relief holes 131 arranged side by side. The second flexible layer 133 is provided with five sets of the relief holes 131, and each set of the relief holes 131 is formed by a plurality of rectangular relief holes 131 arranged side by side.

In addition, the adjacent sets of the relief holes 131 in the same flexible layer are staggered with respect to each other to improve mechanical equilibrium in the same flexible layer when the flexible layer is folded.

When the first embodiment is folded, the principle of folding the substrate structure is that when the OLED display panel is in a folded state, a diameter of the relief holes of the second flexible layer 133 which is located at an inner ring of the flexible structural layer 13 of the folding section A1 is reduced by a compression force so as to buffer the compression force received by the second flexible layer 133. Meanwhile, a diameter of the relief holes 131 of the first flexible layer 132 which is located at an outer ring of the flexible structural layer 13 of the folding section A1 is enlarged by a tensile force and the compassion force so as to buffer the tensile force and the compassion force received by the first flexible layer 132.

Figure 4:
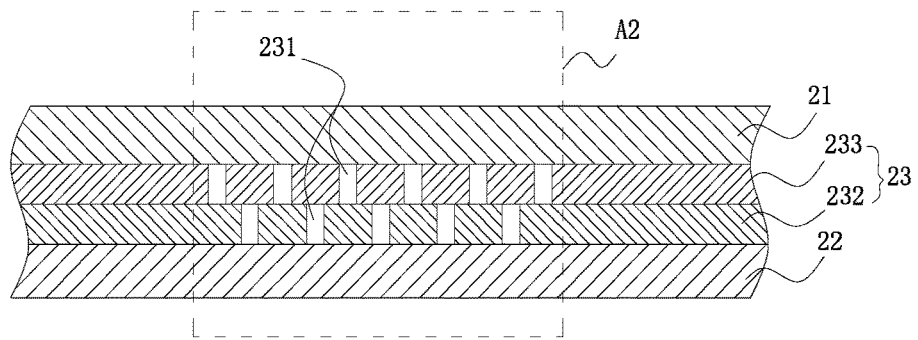
FIG. 4 is a cross-sectional structural view of a second embodiment of the flexible OLED display panel of the present application, shown in a flattened state.
Figure 5:
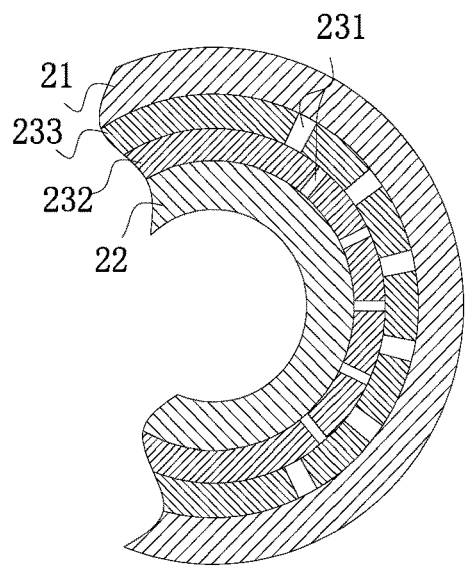
FIG. 5 is a cross-sectional structural view of the second embodiment of the flexible OLED display panel of the present application, shown in a folded state.
Figure 6:
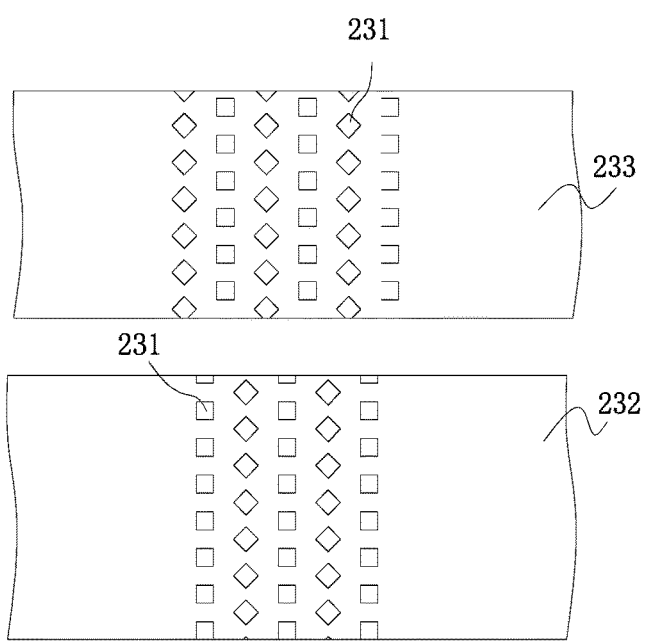
FIG. 6 is a top structural view of the first flexible layer and the second flexible layer of the second embodiment of the flexible OLED display panel of the present application.

Please refer to FIG. 4-6, FIG. 4 is a cross-sectional structural view of a second embodiment of the flexible OLED display panel of the present application, shown in a flattened state; FIG. 5 is a cross-sectional structural view of the second embodiment of the flexible OLED display panel of the present application, shown in a folded state; and FIG. 6 is a top structural view of the first flexible layer and the second flexible layer of the second embodiment of the flexible OLED display panel of the present application.

In the second embodiment of the present application, the OLED display panel 2 comprises a substrate structure 20 and an OLED display module 21. The substrate structure 20 includes a base substrate 22 and a flexible structural layer 23.

The second embodiment is different from the first embodiment in that the flexible structural layer in the second embodiment comprises two of the flexible layers, a first flexible layer 232 is disposed on the base substrate 22, and a second flexible layer 233 is disposed on the first flexible layer 232. When the flexible OLED display panel is outwardly folded, the first flexible layer 232 is located at the inner ring of the folding section A2 and the second flexible layer 233 is located at the outer ring of the folding section A2, and wherein a number of the sets of the relief holes 231 of the second flexible layer 233 is more than a number of the sets of the relief holes 231 of the first flexible layer 232. Such an arrangement not only buffers the compression force received by the second flexible layer 233, but also further buffers the tensile force received by the second flexible layer 233.

In the second embodiment, the number of the sets of the relief holes 231 of the second flexible layer 233 is one more than the number of the sets of the relief holes 231 of the first flexible layer 232.

In the present second embodiment, shapes of the relief holes 231 of each set of the relief holes are selected from the group comprising a point, a rectangle, a diamond, a circle, and combinations thereof. The shape of each of the relief holes 231 could be a line, etc. The shapes of the relief holes 231 are not limited thereto.

Please refer to FIG. 6, in the present second embodiment, the first flexible layer 232 is provided with five sets of the relief holes 231, among which, two of the sets of the relief holes 231 are composed of a plurality of rectangular relief holes 231 arranged side by side, and three of the sets of the relief holes 231 are composed of a plurality of diamond relief holes 231 arranged side by side. Each set of the rectangular relief holes 231 and each set of the diamond relief holes 231 are alternately arranged. The second flexible layer 233 is provided with six sets of the relief holes 231, among which, three of the sets of the relief holes 231 are composed of a plurality of rectangular relief holes 231 which are arranged side-by-side, and three of the sets of the relief holes 231 are composed of a plurality of diamond-shaped relief holes 231 arranged side by side. Each set of the rectangular relief holes 231 and each set of the diamond relief holes 231 are alternately arranged.

In addition, the adjacent sets of the relief holes 231 in the same flexible layer staggered with respect to each other to improve mechanical equilibrium in the same flexible layer when the flexible layer is folded.

When the second embodiment is folded, the principle of folding of the substrate structure is that when the OLED display panel is outwardly folded (i.e., the OLED display panel is folded towards the base substrate 22), a diameter of the relief holes 231 of the first flexible layer 232 which is located at an inner ring of the flexible structural layer 23 of the folding section A2 is reduced by a compression force so as to buffer the compression force received by the first flexible layer 232. Meanwhile, a diameter of the relief holes 231 of the second flexible layer 233 which is located at an outer ring of the flexible structural layer 23 of the folding section A2 is enlarged by a tensile force and the compassion force so as to buffer the tensile force and the compassion force received by the second flexible layer 233.

Figure 7:
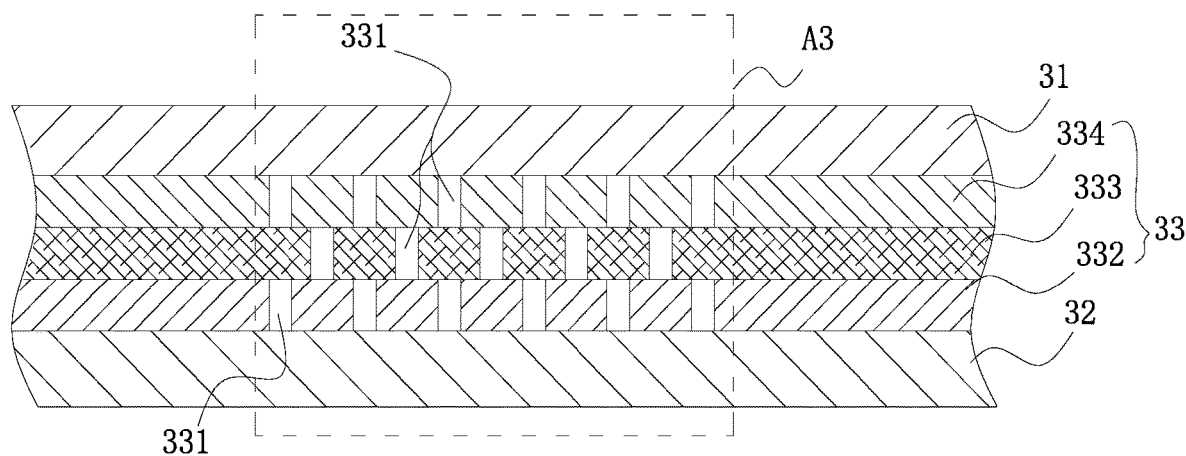
FIG. 7 is a cross-sectional structural view of a third embodiment of the flexible OLED display panel of the present application, shown in a flattened state.

Please refer to FIG. 7, FIG. 7 is a cross-sectional structural view of a third embodiment of a flexible OLED display panel 3 of the present application, shown in a flattened state. The OLED display panel of the third embodiment of the present application comprises a substrate structure 30 and an OLED display module 31. The substrate structure 30 comprises a base substrate 32 and a flexible structural layer 33 disposed on the base substrate 32. The flexible structural layer 33 comprises at least two flexible layers.

The third embodiment is different from the first embodiment in that the flexible structural layer comprises three of the flexible layers, a first flexible layer 332 is disposed on the base substrate 32, a second flexible layer 333 is disposed on the first flexible layer 332, and a third flexible layer 334 is disposed on the second flexible layer 333.

A number of the sets of the relief holes 331 of the first flexible layer 332 is equal to a number of the sets of the relief holes 331 of a third flexible layer 334, and the number of the sets of the relief holes 331 of the second flexible layer 333 is less than the number of the sets of the relief holes 331 of the first flexible layer 332.

In the third embodiment, the number of the sets of the relief holes 331 of the second flexible layer 333 is one less than the number of the sets of the relief holes 331 of the first flexible layer 332.

The number of the sets of the relief holes 331 of the first flexible layer 332 adjacent to the base substrate 32 and the third flexible layer 334 adjacent to the OLED display module 31 are more than the number of the sets of the relief holes 331 of the second flexible layer 333, so that both in-folding and out-folding of the OLED display panel can be achieved without damaging the substrate structure.

In the third embodiment, the relief holes 331 of each set of the relief holes could be in any shapes, such as a rectangle, a diamond, a circle, a regular polygon, a line, etc.

In addition, the principle of folding of the OLED panel is that when the OLED display panel is inwardly folded, a diameter of the relief holes 331 of the first flexible layer 332 which is located at an outer ring of the folding section A3 is enlarged by a tensile force and a compression force so as to buffer the tensile force and the compression force received by the first flexible layer 232. A diameter of the relief holes 331 of the third flexible layer 334 which is located at an inner ring of the folding section A3 is reduced by a compassion force so as to buffer the compassion force received by the third flexible layer 334. The second flexible layer 333 which is located at a middle ring of the folding section A3 is subject to the compassion force and the tensile force. A diameter of the relief holes 331 of the second flexible layer 333 which is adjacent to the first flexible layer is reduced, and a diameter of the relief holes 331 of the second flexible layer 333 which is adjacent to the third flexible layer 334 is enlarged so as to buffer the tensile force and the compression force received by the second flexible layer 333.

When the OLED display panel is outwardly folded, the diameter of the relief holes 331 of the first flexible layer 332 which is located at the inner ring of the folding section A3 is reduced by the compression force so as to buffer the compression force. A diameter of the relief holes 331 of the third flexible layer 334 which is located at the outer ring of the folding section A3 is enlarged by the compression force and the tensile force so as to buffer the compression force and the tensile force received by the third flexible layer 334. The second flexible layer 333 which is located at a middle ring of the folding section A3 is subject to the compassion force and the tensile force. A diameter of the relief holes 331 of the second flexible layer 333 which is adjacent to the first flexible layer 332 is enlarged and a diameter of the relief holes 331 of the second flexible layer 333 which is adjacent to the third flexible layer 334 is reduced so as to buffer the tensile force and the compression force received by the second flexible layer 333.

In addition, the present application further provides a flexible OLED display device comprising the abovementioned OLED flexible display panel. The flexible OLED display panel of the flexible OLED display device of the present application is consistent with the structure of the OLED flexible display panel described hereabove. Please refer to the content of the above flexible OLED display panel of the present application for details.

Accordingly, compared with the OLED display panels of prior art, the flexible OLED display panel of the present application disposes a flexible structural layer having at least two flexible layers and the relief holes of the adjacent flexible layers are staggered to each other. On one hand, all the relief holes achieve respective supports to avoid adverse effects.

On the other hand, when the OLED display panel is folded, a diameter of the relief holes of the flexible layer which is located at an inner ring of the bending section is reduced by a compression force so as to buffer the compression force. A diameter of the relief holes of the flexible layer which is located at an outer ring of the bending section is enlarged by a tensile force so as to buffer the tensile force. The OLED display panel is prevented from being damaged when it is folded.

The present application solves a technical problem that the substrates of existing OLED display panels are prone to damage when folded.

In summary, people with ordinary skills in the art may make various changes and modifications according to the technical solutions and technical concept of the present application, and all such changes and modifications fall into the protection scope of claims appended to the present application.

The invention claimed is:

1. A flexible organic light-emitting diode (OLED) display panel, comprising:
a folding section for folding, wherein a substrate structure is disposed at the folding section and an OLED display module is disposed on the substrate structure, wherein the substrate structure comprises:
a base substrate; and
a flexible structural layer disposed on the base substrate, wherein the flexible structural layer comprises at least two flexible layers arranged one on the other;
wherein the flexible layers comprise a plurality of sets of relief holes defined within the folding section, and the relief holes of the adjacent flexible layers are staggered with respect to each other;
wherein, when the OLED display panel is in a folded state, a diameter of the relief holes of one of the flexible layers which is located at an inner ring of the folding section is reduced by a compression force so as to buffer the compression force received by the flexible layer; and a diameter of the relief holes of another of the flexible layers which is located at an outer ring of the folding section is enlarged by a tensile force so as to buffer the tensile force received by the flexible layer; and
wherein shapes of the relief holes of each set of the relief holes are selected from the group comprising a point, a rectangle, a diamond, a circle, and combinations thereof; and the adjacent sets of the relief holes in the same flexible layer are staggered with respect to each other.

2. The flexible OLED display panel according to claim 1, wherein the flexible structural layer comprises two of the flexible layers, a first flexible layer is disposed on the base substrate, and a second flexible layer is disposed on the first flexible layer; when the flexible OLED display panel is inwardly folded, the first flexible layer is located at the outer ring of the folding section, and the second flexible layer is located at the inner ring of the folding section, and wherein a number of the sets of the relief holes of the first flexible layer is more than a number of the sets of the relief holes of the second flexible layer.

3. The flexible OLED display panel according to claim 2, wherein the number of the sets of the relief holes of the second flexible layer is one more than the number of the sets of the relief holes of the first flexible layer.

4. The flexible OLED display panel according to claim 1, wherein the flexible structural layer comprises two of the flexible layers, a first flexible layer is disposed on the base substrate, and a second flexible layer is disposed on the first flexible layer; when the flexible OLED display panel is outwardly folded, the first flexible layer is located at the inner ring of the folding section and the second flexible layer is located at the outer ring of the folding section, and wherein a number of the sets of the relief holes of the second flexible layer is more than a number of the sets of the relief holes of the first flexible layer.

5. The flexible OLED display panel according to claim 1, wherein the flexible structural layer comprises three of the flexible layers, a first flexible layer is disposed on the base substrate, a second flexible layer is disposed on the first flexible layer, and a third flexible layer is disposed on the second flexible layer; and wherein a number of the sets of the relief holes of the first flexible layer is equal to a number of the sets of the relief holes of a third flexible layer, and a number of the sets of the relief holes of the second flexible layer is less than the number of the sets of the relief holes of the first flexible layer.

6. The flexible OLED display panel according to claim 5, wherein the number of the sets of the relief holes of the second flexible layer is one less than the number of the sets of the relief holes of the first flexible layer.

7. The flexible OLED display panel according to claim 1, wherein the flexible layers are polyimide layers.

8. A flexible organic light-emitting diode (OLED) display panel, comprising:

a folding section for folding, wherein a substrate structure is disposed at the folding section and an OLED display module is disposed on the substrate structure, wherein the substrate structure comprises:

a base substrate; and a flexible structural layer disposed on the base substrate, wherein the flexible structural layer comprises at least two flexible layers arranged one on the other;

wherein the flexible layers comprise a plurality of sets of relief holes defined within the folding section, and the relief holes of the adjacent flexible layers are staggered with respect to each other; and wherein, when the OLED display panel is in a folded state, a diameter of the relief holes of one of the flexible layers which is located at an inner ring of the folding section is reduced by a compression force so as to buffer the compression force received by the flexible layer; and a diameter of the relief holes of another of the flexible layers which is located at an outer ring of the folding section is enlarged by a tensile force so as to buffer the tensile force received by the flexible layer.

9. The flexible OLED display panel according to claim 8, wherein the flexible structural layer comprises two of the flexible layers, a first flexible layer is disposed on the base substrate, and a second flexible layer is disposed on the first flexible layer; when the flexible OLED display panel is inwardly folded, the first flexible layer is located at the outer ring of the folding section, and the second flexible layer is located at the inner ring of the folding section, and wherein a number of the sets of the relief holes of the first flexible layer is more than a number of the sets of the relief holes of the second flexible layer.

10. The flexible OLED display panel according to claim 9, wherein the number of the sets of the relief holes of the second flexible layer is one more than the number of the sets of the relief holes of the first flexible layer.

11. The flexible OLED display panel according to claim 8, wherein the flexible structural layer comprises two of the flexible layers, a first flexible layer is disposed on the base substrate, and a second flexible layer is disposed on the first flexible layer; when the flexible OLED display panel is outwardly folded, the first flexible layer is located at the inner ring of the folding section and the second flexible layer is located at the outer ring of the folding section, and wherein a number of the sets of the relief holes of the second flexible layer is more than a number of the sets of the relief holes of the first flexible layer.

12. The flexible OLED display panel according to claim 8, wherein the flexible structural layer comprises three of the flexible layers, a first flexible layer is disposed on the base substrate, a second flexible layer is disposed on the first flexible layer, and a third flexible layer is disposed on the second flexible layer; and wherein a number of the sets of the relief holes of the first flexible layer is equal to a number of the sets of the relief holes of a third flexible layer, and a number of the sets of the relief holes of the second flexible layer is less than the number of the sets of the relief holes of the first flexible layer.

13. The flexible OLED display panel according to claim 12, wherein the number of the sets of the relief holes of the second flexible layer is one less than the number of the sets of the relief holes of the first flexible layer.

14. The flexible OLED display panel according to claim 8, wherein the flexible layers are polyimide layers.

15. The flexible OLED display panel according to claim 8, wherein shapes of the relief holes of each set of the relief holes are selected from the group comprising a point, a rectangle, a diamond, a circle, and combinations thereof.

16. The flexible OLED display panel according to claim 8, wherein the adjacent sets of the relief holes in the same flexible layer are staggered with respect to each other.

17. A flexible organic light-emitting diode (OLED) display device, comprising:

a folding section for folding, wherein a substrate structure is disposed at the folding section and an OLED display module is disposed on the substrate structure, wherein the substrate structure comprises:

a base substrate; and a flexible structural layer disposed on the base substrate, wherein the flexible structural layer comprises at least two flexible layers arranged one on the other;

wherein the flexible layers comprise a plurality of sets of relief holes defined within the folding section and the relief holes of the adjacent flexible layers are staggered with respect to each other; and wherein, when the OLED display panel is in a folded state, a diameter of the relief holes of one of the flexible layers which is located at an inner ring of the folding section is reduced by a compression force so as to buffer the compression force received by the flexible layer; and a diameter of the relief holes of another of the flexible layers which is located at an outer ring of the folding section is enlarged by a tensile force so as to buffer the tensile force received by the flexible layer.

18. The flexible OLED display device according to claim 17, wherein the flexible structural layer comprises two of the flexible layers, a first flexible layer is disposed on the base substrate, and a second flexible layer is disposed on the first flexible layer; when the flexible OLED display panel is inwardly folded, the first flexible layer is located at the outer ring of the folding section, and the second flexible layer is located at the inner ring of the folding section, and wherein a number of the sets of the relief holes of the first flexible layer is more than a number of the sets of the relief holes of the second flexible layer.

19. The flexible OLED display device according to claim 18, wherein the number of the sets of the relief holes of the second flexible layer is one more than the number of the sets of the relief holes of the first flexible layer.

20. The flexible OLED display device according to claim 17, wherein the flexible structural layer comprises two of the flexible layers, a first flexible layer is disposed on the base substrate, and a second flexible layer is disposed on the first flexible layer; when the flexible OLED display panel is outwardly folded, the first flexible layer is located at the inner ring of the folding section and the second flexible layer is located at the outer ring of the folding section, and wherein a number of the sets of the relief holes of the second flexible layer is more than a number of the sets of the relief holes of the first flexible layer.

* * * * *